(12) United States Patent
Gau et al.

(10) Patent No.: US 6,744,058 B1
(45) Date of Patent: Jun. 1, 2004

(54) GEOMETRIC COMPENSATION METHOD FOR CHARGED PARTICLE BEAM IRRADIATION

(75) Inventors: Tsai-Sheng Gau, Taipei (TW); Li-Jui Chen, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/324,964

(22) Filed: Dec. 20, 2002

(51) Int. Cl.⁷ .................. H01J 37/302; G03F 9/00; G03B 27/00
(52) U.S. Cl. ............... 250/492.22; 250/492.1; 250/492.2; 250/492.21; 250/492.3; 250/396 R; 250/306; 250/307; 250/309; 250/310; 250/311
(58) Field of Search ............ 250/492.1, 492.2, 250/492.22, 492.21, 492.3, 396 R, 306, 307, 309–311

(56) References Cited

U.S. PATENT DOCUMENTS

| | | | |
|---|---|---|---|
| 5,194,741 A | * 3/1993 | Sakamoto et al. | 250/492.2 |
| 5,260,579 A | * 11/1993 | Yasuda et al. | 250/492.2 |
| 5,288,567 A | * 2/1994 | Sakamoto et al. | 430/5 |
| 5,376,802 A | * 12/1994 | Sakamoto et al. | 250/492.23 |
| 5,783,366 A | 7/1998 | Chen et al. | |
| 5,817,442 A | * 10/1998 | Okino | 430/30 |
| 5,856,677 A | * 1/1999 | Okino | 250/492.22 |
| 5,879,842 A | * 3/1999 | Okino | 430/22 |
| 5,962,867 A | 10/1999 | Liu | |
| 6,265,837 B1 | * 7/2001 | Akiyama et al. | 315/503 |
| 6,331,885 B1 | * 12/2001 | Nishi | 355/53 |
| 6,433,349 B2 | * 8/2002 | Akiyama et al. | 250/505.1 |
| 6,590,634 B1 | * 7/2003 | Nishi et al. | 355/53 |
| 2001/0022502 A1 | * 9/2001 | Akiyama et al. | 315/503 |
| 2002/0146628 A1 | * 10/2002 | Ota | 430/22 |

\* cited by examiner

*Primary Examiner*—John Lee
*Assistant Examiner*—Bernard Souw
(74) *Attorney, Agent, or Firm*—Tung & Associates

(57) ABSTRACT

A charged particle beam method for irradiating an array of sub-regions within an areal region within a substrate with a series of shots of a charged particle beam provides that a sequencing of irradiation of the array of sub-regions is geometrically determined such as to minimize charged particle beam deflection when irradiating the series of sub-regions with the series of shots of the charged particle beam. Due to the geometric determination which provides the minimized charged particle beam deflection, the charged particle beam method has enhanced accuracy.

20 Claims, 2 Drawing Sheets

| 1 | 114 | 77 | 78 | 120 | 59 | 119 | 49 | 97 | 94 | 9 |
|---|---|---|---|---|---|---|---|---|---|---|
| 105 | 16 | 79 | 80 | 81 | 60 | 61 | 50 | 98 | 11 | 116 |
| 111 | 31 | 32 | 4 | 82 | 83 | 62 | 51 | 10 | 74 | 73 |
| 117 | 112 | 33 | 34 | 15 | 17 | 12 | 76 | 75 | 104 | 103 |
| 27 | 28 | 29 | 30 | 45 | 24 | 41 | 38 | 37 | 36 | 35 |
| 91 | 92 | 93 | 54 | 55 | 3 | 40 | 39 | 68 | 67 | 121 |
| 101 | 102 | 52 | 53 | 19 | 47 | 48 | 13 | 70 | 66 | 65 |
| 42 | 43 | 44 | 18 | 72 | 46 | 23 | 26 | 5 | 100 | 99 |
| 86 | 87 | 7 | 69 | 71 | 22 | 84 | 25 | 90 | 64 | 63 |
| 85 | 8 | 110 | 57 | 96 | 107 | 58 | 21 | 89 | 14 | 113 |
| 6 | 108 | 109 | 56 | 95 | 106 | 20 | 118 | 115 | 88 | 2 |

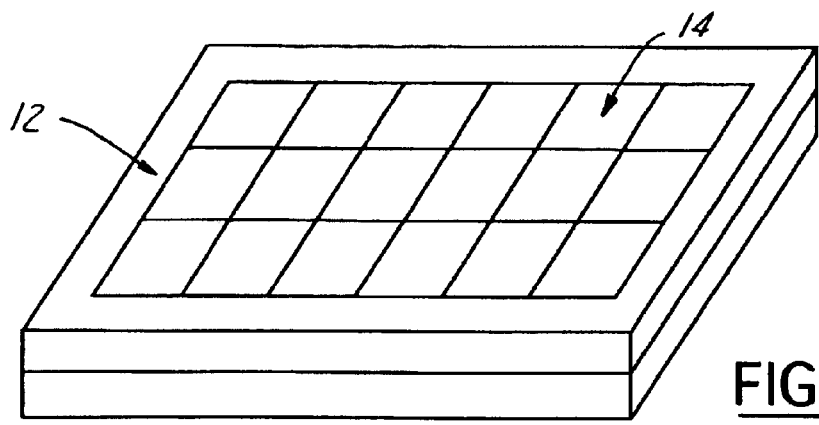
FIG. 1
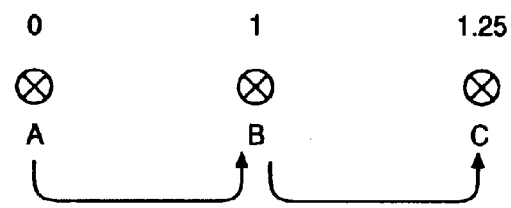
FIG. 2
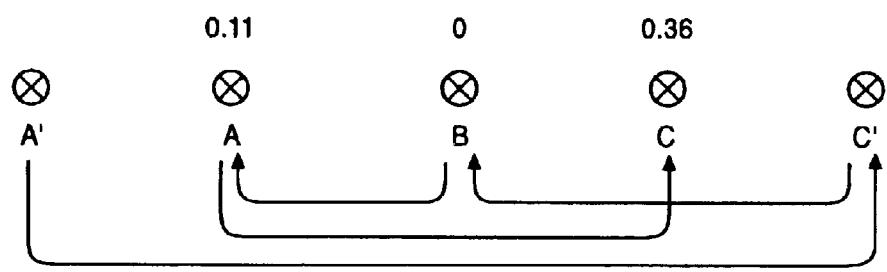
FIG. 3
| 11 | 22 | 33 | 44 | 55 | 66 | 77 | 88 | 99 | 110 | 121 |
| 10 | 21 | 32 | 43 | 54 | 65 | 76 | 87 | 98 | 109 | 120 |
| 9 | 20 | 31 | 42 | 53 | 64 | 75 | 86 | 97 | 108 | 119 |
| 8 | 19 | 30 | 41 | 52 | 63 | 74 | 85 | 96 | 107 | 118 |
| 7 | 18 | 29 | 40 | 51 | 62 | 73 | 84 | 95 | 106 | 117 |
| 6 | 17 | 28 | 39 | 50 | 61 | 72 | 83 | 94 | 105 | 116 |
| 5 | 16 | 27 | 38 | 49 | 60 | 71 | 82 | 93 | 104 | 115 |
| 4 | 15 | 26 | 37 | 48 | 59 | 70 | 81 | 92 | 103 | 114 |
| 3 | 14 | 25 | 36 | 47 | 58 | 69 | 80 | 91 | 102 | 113 |
| 2 | 13 | 24 | 35 | 46 | 57 | 68 | 79 | 90 | 101 | 112 |
| 1 | 12 | 23 | 34 | 45 | 56 | 67 | 78 | 89 | 100 | 111 |
FIG. 4

| 1 | 114 | 77 | 78 | 120 | 59 | 119 | 49 | 97 | 94 | 9 |
|---|---|---|---|---|---|---|---|---|---|---|
| 105 | 16 | 79 | 80 | 81 | 60 | 61 | 50 | 98 | 11 | 116 |
| 111 | 31 | 32 | 4 | 82 | 83 | 62 | 51 | 10 | 74 | 73 |
| 117 | 112 | 33 | 34 | 15 | 17 | 12 | 76 | 75 | 104 | 103 |
| 27 | 28 | 29 | 30 | 45 | 24 | 41 | 38 | 37 | 36 | 35 |
| 91 | 92 | 93 | 54 | 55 | 3 | 40 | 39 | 68 | 67 | 121 |
| 101 | 102 | 52 | 53 | 19 | 47 | 48 | 13 | 70 | 66 | 65 |
| 42 | 43 | 44 | 18 | 72 | 46 | 23 | 26 | 5 | 100 | 99 |
| 86 | 87 | 7 | 69 | 71 | 22 | 84 | 25 | 90 | 64 | 63 |
| 85 | 8 | 110 | 57 | 96 | 107 | 58 | 21 | 89 | 14 | 113 |
| 6 | 108 | 109 | 56 | 95 | 106 | 20 | 118 | 115 | 88 | 2 |

FIG. 5

| 1 | 199 | 202 | 203 | 156 | 221 | 224 | 33 | 223 | 189 | 92 | 215 | 161 | 208 | 11 |
|---|---|---|---|---|---|---|---|---|---|---|---|---|---|---|
| 77 | 78 | 15 | 204 | 157 | 169 | 34 | 158 | 191 | 190 | 93 | 163 | 162 | 52 | 207 |
| 211 | 124 | 125 | 17 | 170 | 171 | 36 | 183 | 192 | 110 | 94 | 164 | 12 | 127 | 126 |
| 57 | 58 | 59 | 73 | 4 | 38 | 40 | 35 | 130 | 111 | 112 | 16 | 129 | 128 | 213 |
| 216 | 159 | 160 | 81 | 82 | 83 | 37 | 132 | 131 | 113 | 13 | 72 | 62 | 61 | 60 |
| 151 | 184 | 79 | 80 | 114 | 10 | 44 | 42 | 41 | 21 | 146 | 145 | 180 | 179 | 218 |
| 152 | 153 | 154 | 155 | 115 | 116 | 18 | 69 | 70 | 67 | 64 | 63 | 181 | 178 | 177 |
| 25 | 185 | 26 | 84 | 85 | 86 | 87 | 3 | 71 | 68 | 65 | 150 | 31 | 182 | 30 |
| 222 | 175 | 176 | 27 | 29 | 43 | 28 | 51 | 7 | 66 | 39 | 32 | 149 | 140 | 139 |
| 117 | 118 | 119 | 122 | 123 | 19 | 109 | 50 | 105 | 6 | 144 | 143 | 142 | 141 | 217 |
| 200 | 20 | 120 | 121 | 14 | 107 | 108 | 49 | 104 | 103 | 24 | 91 | 90 | 89 | 88 |
| 53 | 54 | 55 | 56 | 98 | 106 | 168 | 48 | 102 | 101 | 138 | 5 | 136 | 135 | 214 |
| 212 | 173 | 174 | 9 | 97 | 166 | 167 | 47 | 194 | 100 | 137 | 76 | 23 | 134 | 133 |
| 172 | 20 | 148 | 196 | 96 | 165 | 206 | 46 | 193 | 99 | 198 | 75 | 188 | 22 | 209 |
| 8 | 210 | 147 | 195 | 95 | 219 | 205 | 45 | 225 | 220 | 197 | 74 | 187 | 186 | 2 |

FIG. 6

GEOMETRIC COMPENSATION METHOD FOR CHARGED PARTICLE BEAM IRRADIATION

BACKGROUND OF THE INVENTION

1. Field of the Invention

The present invention relates generally to charged particle beam irradiation methods employed for fabricating microelectronic products. More particularly, the present invention relates to compensated charged particle beam irradiation methods employed for fabricating microelectronic products.

2. Description of the Related Art

Common in the microelectronic product fabrication art is the use of charged particle beam irradiation methods and apparatus for both metrologic purposes and processing purposes. Charged particle beams may include, but are not limited to, electron beams and ion beams. Within microelectronic product fabrication, electron beams are particularly common. They are employed within electron microscopy measurement methods, as well as electron beam photoexposure processing methods.

While charged particle beam irradiation methods are thus common in the microelectronic product fabrication art and often essential in the microelectronic product fabrication art, they are nonetheless not entirely without problems.

In that regard, charged particle beams are known to charge non-conducting substrates in a fashion which generally compromises a measurement accuracy or a processing accuracy of a charged particle beam irradiation method.

It is thus desirable in the microelectronic product fabrication art to provide charged particle beam irradiation methods and apparatus with enhanced accuracy.

It is towards the foregoing object that the present invention is directed.

Various charged particle beam methods having desirable properties have been disclosed within the microelectronic product fabrication art.

Included but not limiting among the methods are methods disclosed within: (1) Chen et al., in U.S. Pat. No. 5,783,366 (a photoresist implant method for eliminating charging effects within a scanning electron microscopy measurement method); and (2) Liu, in U.S. Pat. No. 5,962,867 (a test structure design which provides for attenuated charging during scanning electron microscopy measurement of integrated circuit products).

Desirable are additional charged particle beam irradiation methods with enhanced accuracy.

It is towards the foregoing object that the present invention is directed.

SUMMARY OF THE INVENTION

A first object of the invention is to provide a charged particle beam irradiation method for measuring or processing a microelectronic product.

A second object of the invention is to provide a charged particle beam irradiation method in accord with the first object of the invention, wherein the charged particle beam irradiation method has enhanced accuracy.

In accord with the objects of the invention, the invention provides a charged particle beam irradiation method for irradiating a substrate.

To practice the method of the invention, there is first provided a substrate having contained therein a areal region comprising an array of sub-regions intended to be irradiated with a corresponding series of shots of a charged particle beam. There is then irradiated the array of sub-regions with the series of shots of the charged particle beam, wherein a sequencing of irradiation of the array of sub-regions is geometrically determined such as to minimize a charged substrate induced charged particle beam deflection force when irradiating the series of sub-regions with the series of shots of the charged particle beam.

The present invention provides a charged particle beam method for measuring or processing a microelectronic product, wherein the charged particle beam method has enhanced accuracy.

The invention realizes the foregoing object within the context of irradiation of each of an array of sub-regions within an areal region of a substrate with a series of shots of a charged particle beam by sequencing the irradiation of each of the array of sub-regions geometrically such as to minimize charged particle beam deflection when irradiating the array of sub-regions with the series of shots of the charged particle beam.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein:

FIG. 1 shows a schematic isometric diagram illustrating a substrate which may be irradiated with a charged particle beam in accord with the invention.

FIG. 2 and FIG. 3 show a pair of linear diagrams illustrating charged particle beam shot sequencing and charged particle beam deflection not in accord with the invention and in accord with the invention.

FIG. 4 shows a schematic plan-view diagram of charged particle beam shot areal placement not in accord with the invention.

FIG. 5 shows a schematic plan-view diagram of charged particle beam shot areal placement in accord with a first embodiment of the invention.

FIG. 6 shows a schematic plan-view diagram of charged particle beam shot areal placement in accord with a second embodiment of the invention.

DESCRIPTION OF THE PREFERRED EMBODIMENTS

The present invention provides a charged particle beam method for measuring or processing a microelectronic product, wherein the charged particle beam method has enhanced accuracy.

The invention realizes the foregoing object within the context of irradiation of each of an array of sub-regions within an areal region of a substrate with a series of shots of a charged particle beam by sequencing the irradiation of each of the array of sub-regions geometrically such as to minimize a charged substrate induced charge particle beam deflection force when irradiating the array of sub-regions with the series of shots of the charged particle beam.

While the present invention provides particular value within the context of electron beam irradiation methods and apparatus for electron microscopy measurement of microelectronic products and electron beam photoexposure of photoresist layers employed in fabricating microelectronic products, the invention is not intended to be so limited. Rather, the invention may be employed within the context of charged particle beams including but not limited to electron beams and ion beams of either polarity.

FIG. 1 shows an isometric diagram of a microelectronic product which may be irradiated with a charged particle beam in accord with the present invention.

FIG. 1 shows a substrate 10, which may be, and typically is, a multi-layered substrate. Within the invention, the substrate 10 may comprise a semiconductor substrate, a ceramic substrate or an optoelectronic substrate.

FIG. 1 also shows an areal region 12 comprising an array of sub-regions, where it is intended within the invention that each of the array of sub-regions is irradiated with a corresponding series of shots from a charged particle beam 14. Within the invention, each sub-region within the array of sub-regions has bi-directional (areal) dimensions of from about 0.1 to about 2.0 microns. In addition, within the invention, the charged particle beam 14 may be selected from the group including but not limited to electron beams and ion beams of either polarity.

Within the context of electron beams, irradiation of the substrate 10 may occur within the context of a scanning electron microscopy measurement of the substrate 10. Within the context of both electron beams and ion beams of both polarities, irradiation of the substrate 10 may alternatively occur within the context of photoexposing a blanket photoresist layer which comprises the substrate 10, or otherwise processing a laminated surface layer which comprises the substrate 10.

FIG. 2 and FIG. 3 show a pair of linear diagram illustrating charged particle beam shot geometric placement and charged particle beam deflection force, respectively, not in accord with the invention and in accord with the invention.

FIG. 2 illustrates charged particle beam shot geometric placement and charged particle beam deflection force not in accord with the invention.

Fig. 2 illustrates a progression of charged particle beam shot placement linearly and sequentially from a position A to a position B finally to position C. As charged particle beam shots are linearly and sequentially progress from the position A to the position B and finally to position C, a relative deflection force of a charged particle beam is experienced due to charging of a substrate in a sub-region previously irradiated with the charged particle beam. Such a relative deflection force is implicitly intended as a deflection force experienced by the charged particle beam due to electrostatic influence (i.e., coulomb force) of the charged particle beam by residual charge in a sub-region or sub-regions of the substrate previously irradiated, in comparison with no deflection force experienced by the charged particle beam under circumstances of no residual charge due to no sub-region or sub-regions being previously irradiated. In FIG. 2, when a charged particle beam deflection force is arbitrarily assigned a value of 1 at the position B due to presence of a residual charge at position A, a charged particle beam deflection force will have a relative value of 1.25 at position C, as to residual charge at both the position A and position B. FIG. 2 assumes a single charge a charged particle beam for irradiation of each of position A, position B and position C, as well as an equal separation distance between A and B and C. In addition, the calculations of charged particle beam deflection is predicated upon classic electrostatic considerations which provide that an attraction or repulsive force of a first fixed charge with respect to a second fixed charge spaced therefrom dissipates in magnitude as an inverse of the square of the distance from of separation of the fixed charges.

As is understood by a person skilled in the art, increased values of charged particle beam deflection force are particularly undesirable within charged particle beam irradiation methods since such deflection force generally comprises the accuracy of placement of charged particle beam shot.

FIG. 3 illustrates charged particle beam shot geometric placement and charged particle beam deflection force in accord with the invention.

FIG. 3 corresponds generally with FIG. 2 with respect to the existence of the position A, the position B and the position C each intended to receive a shot of charged particle beam radiation. However, FIG. 3 also provides for an additional two positions, a position A' separated from the position A and a position C' separated from the position C. In FIG. 3 all separation distances between neighboring positions A'–A, A–B, B–C and C–C' are equal and the same as in FIG. 2. FIG. 3, also illustrates a progression of charged particle beam shot placement starting with position A', then progressing to position C', then progressing to position B, then progressing to position A and finally progressing to position C. As is further illustrated the linear diagram of FIG. 3, such as progression provides a relative deflection force of a charged particle beam of 0.11 at position A, zero at position B and 0.36 at position C, each of which is considerably less than corresponding relative deflections forces as illustrated for the corresponding positions A, B and C in FIG. 2. Thus, the context of the invention as illustrated in FIG. 3 a charged particle beam irradiation of a substrate may occur with greater accuracy since a charged particle beam is susceptible to considerably less deflection force.

FIG. 4 shows a schematic plan-view diagram of geometric progression of charged particle beam shot placement when irradiating a bi-directional array of sub-regions with a charged particle beam not in accord with the invention. As is illustrated within FIG. 3, charged particle beam shot placement is progressed from column to column from the left of FIG. 4 to the right of FIG. 4. In addition, within each column, charged particle beam shot placement is progressed sequentially from the bottom of a column to a top of a column. The charged particle beam shot placement as illustrated in FIG. 4 corresponds in two dimensions generally with the charged particle beam shot placement in FIG. 2, with resultant sequential increase in charged particle beam deflection force when irradiating latter sub-regions the array as illustrated in FIG. 4.

FIG. 5 shows a schematic plan-view diagram of geometric progression of charged particle beam shot placement when irradiating a bi-directional array of sub-regions within a substrate in accord with a first embodiment of invention.

As illustrated in FIG. 5, charged particle beam shot placement is progressed between outer and inner sub-regions within the areal array of sub-regions. In accord with the linear shot placement diagram of FIG. 3, such a linear mixed placement of charged particle beam shots provides for a compensation and reduction of a charged particle beam deflection force when irradiating the series of sub-regions as illustrated within FIG. 5.

FIG. 6 shows a schematic plan-view diagram of geometric progression of charged particle beam shot placement when irradiating a bi-directional array of sub-regions within a substrate in accord with a second embodiment of the invention.

The plan-view diagram of FIG. 6 corresponds generally with the plan-view diagram of FIG. 5, but in addition to a core array of sub-regions which comprise an areal region which is intended to be irradiated with a series of charged particle beam shots, the core region is annularly surrounded by an annular region. The annular region comprises an additional series of sub-regions which in general is not intended to be irradiated with a series of charged particle shots for either a measurement or processing purpose. However, the additional series of sub-regions is nonetheless irradiated with a series of particle beam shots as dummy regions solely for the purpose of attenuating charged particle beam deflection. Within the second embodiment of the invention, charged particle beam irradiation of the additional annular region provides, in particular, for attenuation of charged particle beam deflection in peripheral positions within the core region which is intended to be irradiated.

In order to develop the charged particle beam shot placement diagrams of FIG. 5 and FIG. 6, one may first determine a total number of sub-regions within a region for which charged particle beam shots are to be provided. Included within this, determination is a number of annular dummy sub-regions, in addition to a number of core sub-regions for which charged particle beam irradiation provides a measurement or processing function.

One may then typically select a corner sub-region as a first sub-region to receive a charged particle beam shot. One then calculates for all remaining sub-regions a charged particle beam deflection force expected due to substrate charging from the first region after irradiation with the charged particle beam shot. In accord with discussion above, such a calculation may be made while employing classical electrostatic (i.e., colomb force) considerations which provide for electrostatic force dissipation as an inverse function of the square of distance an between a pair of electrostatic charge sources. Insofar as the invention may provide a bi-directional array of sub-regions receiving a series of charged particle beam shots, the invention thus implicitly or inherently may provide for a vector analysis when determining deflection forces. One then selects for receiving the next charged particle beam shot the sub-region with the lowest expected charged particle beam deflection force. One then repeats the calculation of charged particle beam deflection force for the remaining sub-regions and again deflects the sub-region with the lowest expected charged particle beam deflection force sequentially, for all remaining sub-regions which are to receive charged particle beam shots.

The embodiments of the invention as illustrated within FIG. 5 and FIG. 6 provide a charged particle beam method for irradiating a substrate employed within a microelectronic product, wherein the charged particle beam method provides for enhanced accuracy when irradiating the substrate. The present invention realizes the foregoing object by irradiating each of an array of sub-regions with a corresponding series of shots of a charged particle beam, wherein a sequencing of irradiation of each of the array of sub-regions is geometrically determined such as to minimize charged particle beam deflection force when irradiating each of the array of sub-regions with the series of shots of the charged particle beam.

The preferred embodiments of the invention are illustrative of the invention rather than limiting of the invention. Revisions and modifications may be made to methods, materials, structures and dimensions in accord with the preferred embodiments of the invention while still providing a method in accord with the invention further in accord with the accompanying claims.

What is claimed is:

1. A charged particle beam method comprising:
   providing a substrate having contained therein an areal region comprising of an array of sub-regions intended to be irradiated with a corresponding series of shots of a charged particle beam; and
   irradiating the array of sub-regions with the series of shots of the charged particle beam, wherein a sequencing of irradiation of the array of sub-regions is geometrically determined such as to minimize a charged substrate induced charged particle beam deflection force when irradiating the series of sub-regions with the series of shots of the charged particle beam.

2. The method of claim 1 wherein the substrate comprises a semiconductor substrate.

3. The method of claim 1 wherein the substrate comprises a ceramic substrate.

4. The method of claim 1 wherein the charged particle beam is an electron beam.

5. The method of claim 1 wherein the charged particle beam is an ion beam.

6. The method of claim 1 wherein the charged particle beam is a charged particle measurement beam.

7. The method of claim 1 wherein the charged particle beam is a charged particle processing beam.

8. A charged particle beam method comprising:
   providing a substrate having contained therein a first areal region comprising a first array of sub-regions intended to be irradiated with a corresponding first series of shots of a charged particle beam;
   defining annularly surrounding the first areal region and a second areal region comprising a second annular array of sub-regions which serve as dummy regions with respect to irradiation with a corresponding second series of shots the charged particle beam; and
   irradiating the first array of sub-regions and second annular array of sub-regions with the first and second series of shots of the charged particle beam, wherein a sequencing of irradiation of the first array of sub-regions and the second annular array of sub-regions is geometrically determined such as to minimize a charged substrate induced charged particle beam deflection force when irradiating the first array of sub-regions with the first of shots of the charged particle beam.

9. The method of claim 8 wherein the substrate comprises a semiconductor substrate.

10. The method of claim 8 wherein the substrate comprises a ceramic substrate.

11. The method of claim 8 wherein the charged particle beam is an electron beam.

12. The method of claim 8 wherein the charged particle beam is an ion beam.

13. The method of claim 8 wherein the charged particle beam is a charged particle measurement beam.

14. The method of claim 8 wherein the charged particle beam is a charged particle processing beam.

15. A charged particle beam method comprising:
   (1) providing a substrate having contained therein an areal region comprising an areal array of sub-regions subject to irradiation with a series of shots of a charged particle beam;
   (2) irradiating a first sub-region with a shot of the charged particle beam;
   (3) calculating for the remaining sub-regions a charged substrate induced charged particle beam deflection force based upon residual charge from all previous charged particle beam irradiated regions;

(4) selecting the remaining sub-regions with the minimum charged particle beam deflection force and irradiating that sub-region with the charged particle beam next; and (5) repeating step (3) and step (4) until all sub-regions have been irradiated with the charged particle beam.

16. The method of claim 15 wherein the first region is a corner region.

17. The method of claim 15 wherein the areal region further comprises an annular region of dummy sub-regions which annularly surround the areal array of sub-region and wherein the annular region of dummy sub-regions is also subject to irradiation with the series of shots of the charged particle beam.

18. The method of claim 15 wherein the substrate is selected from the group consisting of a semiconductor substrate and a ceramic substrate.

19. The method of claim 15 wherein the charged particle beam is selected from the group consisting of an electron beam and an ion beam.

20. The method of claim 15 wherein the charged particle beam is selected from the group consisting of a measurement beam and a processing beam.

* * * * *